(12) United States Patent
Sellin et al.

(10) Patent No.: US 6,654,394 B1
(45) Date of Patent: *Nov. 25, 2003

(54) LASER FREQUENCY STABILIZER USING TRANSIENT SPECTRAL HOLE BURNING

(75) Inventors: Peter B. Sellin, Bozeman, MT (US); Nicholas M. Strickland, Lower Hut (NZ); John L. Carlsten, Bozeman, MT (US); Rufus L. Cone, Bozeman, MT (US)

(73) Assignee: The Research and Development Institute, Inc., Bozeman, MT (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/019,429
(22) PCT Filed: Jun. 30, 2000
(86) PCT No.: PCT/US00/18072
§ 371 (c)(1),
(2), (4) Date: Jul. 17, 2002
(87) PCT Pub. No.: WO01/03259
PCT Pub. Date: Jan. 11, 2001

Related U.S. Application Data

(60) Provisional application No. 60/141,828, filed on Jul. 1, 1999.

(51) Int. Cl.[7] .................................................. H01S 3/13
(52) U.S. Cl. ........................ 372/32; 372/26; 372/29.02
(58) Field of Search ...................... 372/26, 32, 29.02, 372/28, 18

(56) References Cited

U.S. PATENT DOCUMENTS

| 5,297,076 A | * | 3/1994 | Jefferson et al. | ............. 365/119 |
| 5,532,998 A | * | 7/1996 | Durham | ...................... 369/116 |
| 6,516,014 B1 | * | 2/2003 | Sellin et al. | ................... 372/32 |

* cited by examiner

*Primary Examiner*—Leon Scott, Jr.
(74) *Attorney, Agent, or Firm*—McDermott, Will & Emery

(57) ABSTRACT

Techniques for stabilizing a laser at a selectable frequency include splitting an output beam from an electrically adjustable laser into a first beam and a second beam. The second beam is transmitted through a modulator. Then the second beam is transmitted through a transient spectral hole burning material onto a detector. The laser is electronically adjusted in response to a detector output from the detector which senses the changes in the modulated second beam after it passes through the transient spectral hole burning material.

Additions here to encompass the mode-locked case?

20 Claims, 13 Drawing Sheets

LASER FREQUENCY STABILIZER USING TRANSIENT SPECTRAL HOLE BURNING

This application is a PCT/US00/18072 filed Jun. 30, 2000, which claims benefit of provisional application 60/141,828, filed Jul. 1, 1999.

BACKGROUND

1. Field of the Invention

This application relates to a device whereby the frequency and phase of a laser is actively stabilized by locking to a transient spectral hole in a solid state or other condensed phase reference material.

2. Description of the Related Art

Lasers emit electromagnetic radiation characterized by the optical range of the spectrum where wavelengths are expressed in nanometers (nm) corresponding to $10^{-9}$m, and frequencies are expressed in megaHertz (MHz) corresponding to $10^6$ Hz, or gigaHertz (GHz) corresponding to $10^9$ Hz, or teraHertz (THz) corresponding to $10^{12}$ Hz, where one Hz is one cycle per second.

Previous laser stabilization techniques have relied on frequency references based on Fabry-Perot interferometer resonances or the center frequencies of transitions in atomic or molecular vapors.

In the prior art, for example, the Pound-Drever-Hall laser frequency locking technique utilizes frequency modulated (FM) spectroscopy techniques to actively lock the laser frequency to a reflection mode of a Fabry-Perot interferometer.

Use of an error signal to stabilize a laser frequency of a tunable laser according to the Pound-Drever-Hall technique is shown in FIGS. 1A and 1B. In FIG. 1A a laser 110 emits a beam along path 161 impinging on a phase modulator 112. The radio frequency (rf) signal generator 142 supplies an electrical signal transmitted by wire to the modulator 112 and to mixer 140. The modulator 112 modulates and passes a first beam portion along path 162 to a beam splitter 114. Beam splitter 114 passes a second beam portion along a beam path 163 to a cavity, 116 between mirrors 115 and 117, usually enclosed in a vacuum chamber and extremely well isolated from vibrations. The cavity 116 is tuned to a reference frequency by choice of spacing between mirrors 115 and 117 and the cavity stores and re-emits a reference beam having an energy peak at the reference frequency along path 163 to splitter 114. At the beam splitter 114 both the modulated beam, which reflects immediately off mirror 115, and the reference beam are diverted along path 165 to a detector 120 which outputs a detector electrical signal. The detector reference signal contains rf frequency components generated by the interference between the modulated beam and the cavity reference beam. This detector electrical signal is filtered at filter 130 to remove unwanted harmonic frequencies and to generate an error signal that is output to the mixer 140. At mixer 140, the rf signal from the rf signal generator 142 is combined with the error signal at rf frequencies to demodulate the error signal to lower frequencies where it is used as a control signal that is output to the laser servo electronics 150. The servo electronics 150 tune the laser 110 in response to the control signal received.

The required frequency modulation, achieved in the above realization by use of the modulator 112, also may be achieved by other means, such as current modulation of the laser diode driver current under control of the radio frequency (rf) signal generator 142, when a laser diode is used as the optical source 110. For other lasers, other equivalent means of modulation also may be understood.

FIG. 1B shows the output 125 of cavity transmission detector 122 and the error signal 145 output (showing one example, from a class of possible frequency modulation quadrature signals) by error signal detector 120 combined with the mixer 140 which is sent to the servo electronics 150 as the modulated laser frequency beam 162 is tuned across the cavity reference frequency. The amplitude of the error signal 145 at a given frequency in the vicinity of the lock point 147 is related to the size and direction of the deviation of frequency from the reference frequency at the lock point 147. Thus the greater the deviation of the laser frequency from the reference frequency, the greater is the error signal and the greater is a component of the input to the servo electronics 150 to tune the laser back toward the reference frequency at the lock point 147. The stability of the laser frequency is limited by the characteristics of the peak in the cavity transmission signal used as the reference frequency detected by the detector 120 and the quality of the entire feedback system of FIGS. 1A and 1B.

When quoting the degree of stability of a laser, one simultaneously quotes the degree of stabilization and the time period of observation.; the two are correlated in ways that depend on each laser system. To evaluate locking stability, two lasers are locked to adjacent modes of the same cavity. The beat signal between the two laser frequencies is then monitored for fluctuations. A relative locking performance of 1 part in $10^5$ of the interferometer linewidth can be accomplished with a high finesse interferometer cavity having a resonance linewidth of less than 10 kHz, leading to relative stability between two lasers at the sub-Hz level for nominally a minute, when substantial effort is made to vibrationally and thermally isolate the cavity from its surrounding environment. The short-term drift of the frequency of either of these lasers arises from thermal length changes, mechanical creep, vibration, or other variation in the length of the reference cavity and hence resonance frequency. Attempts have been made to approach absolute stability using Fabry-Perot cavities made from sapphire and kept at cryogenic temperatures to achieve a 3 kHz drift over 6 months.

Atomic transitions are commonly used to lock a laser to a specific, absolute frequency. A typical arrangement would substitute a fixed atomic resonance for the cavity resonance and allow the modulated beam to transmit through a gas-phase sample before collecting it on a photodetector. Today's precision clocks and oscillators are based on well-studied microwave transition frequencies of rubidium, cesium, hydrogen, and mercury atoms in oscillators and masers, carbon dioxide lasers, cold calcium-stabilized diode lasers, lasers stabilized to optical transitions of iodine, cesium, rubidium, mercury, and ytterbium among others. Optical frequency standards in the communications bands of 1.3 and 1.5 micron wavelength are also of interest. Among the principal advantages of existing microwave and optical standards are that the transition frequencies of an atom are unique to its type, i.e. predetermined by nature and that FM locking techniques typically select the center of those transitions with high precision. A difficulty is that when the frequencies are not exactly those of interest, they must be transferred through a potentially elaborate chain of precisely controlled optical and radio frequency (rf) synthesis, such as frequency doubling and mixing or parametric oscillation sums and differences. That complication may be simplified by use of new optical frequency combs based on femtosecond mode-locked lasers and nonlinear effects in optical fibers. Lastly, strong optical dipole transitions typically have spectral linewidths in the 10's of MHz (megaHertz, i.e., $10^6$ Hz)—not especially narrow for use as a precise frequency discriminator for laser locking, though examples of higher multi-pole moment transitions with narrower linewidths but weaker transitions do exist; one such transition is the $^2S_{1/2}$-$^2D_{5/2}$ electric-quadrupole transition of a single trapped $^{199}Hg^+$ ion (wavelength of 282 nm and natural linewidth of 2 Hz). The present optimum realization of the $^{199}Hg^+$ ion standard requires operation of a Paul ion trap at liquid helium temperatures.

Another frequency locking technique involves stabilization to a Lamb dip in a gas vapor cell. For the Lamb dip, the gaseous motion of the atoms produces a Doppler shifted distribution of frequencies creating an inhomogeneously broadened absorption-line. A strong laser, intense enough to saturate a particular velocity subset of these atoms can temporarily create a spectral hole anywhere in the absorption profile until it is turned off and the hole disappears (absorption reappears). A less intense probe laser can be locked to the hole created in the presence of the strong laser. The frequency stability of the Lamb dip spectral hole is determined by that of the strong laser. To remove this external stability dependence, the more typical arrangement is to use a single laser divided into two counter-propagating beams, strong and weak. For a lock to occur, the two beams must interact with the same velocity subset of atoms that must be the non-Doppler shifted subset. The lock is then constrained to the center of the inhomogeneous absorption.

The current US atomic frequency standard is the cesium-fountain standard, called NIST-F1. It uses laser-cooled atoms that are slowed to near absolute zero temperature (and hence near zero velocity) and then tossed vertically through a microwave cavity, after which the cooling lasers are turned off and the atoms return under the influence of gravity to a detector below the level of the microwave cavity. Because the atoms move at much lower speed than are found in the previous atomic beam standards, this standard has smaller systematic frequency shifts.

Condensed phase spectral hole burning materials are known. Absorption features of ions or molecules doped into condensed phase materials are spectrally broadened by two main classes of mechanisms. Homogeneous broadening is the fundamental broadening experienced by all ions or molecules independently, and arises from the quantum-mechanical relationship between the lineshape and the dephasing time of the excited ion. At cryogenic temperatures, such homogeneous linewidths have been measured, using the photon-echo technique, to be as narrow as 100 Hz or less, orders of magnitude sharper than most gas phase transitions. Inhomogeneous broadening, such as that of the inhomogeneous absorption profile 210 depicted in FIG. 2A, arises from the overlap of the quasi-continuum of individual spectra 220 of all of the ions or molecules in the condensed phase material, which have microscopically different environments and therefore slightly different transition frequencies. The extent of this envelope can be anywhere from hundreds of MHz to the THz (teraHertz, i.e., millions of MHz) range.

Persistent spectral hole burning can be accomplished by using a narrow-band laser to selectively excite only the small fraction of ions or molecules whose frequencies around a chosen central frequency 240 coincide with that of the laser. If some mechanism exists to remove those ions or molecules from the absorbing population, or to change their resonant frequencies, then the inhomogeneous absorption profile can be altered, leaving a "spectral hole" 250 at the frequency of the laser, as seen in FIG. 2B depicting the altered inhomogeneous absorption profile 230. In the cases of interest here, the homogeneous linewidth 220''' is many orders of magnitude smaller than the inhomogeneous linewidth 210, and by probing with a tunable laser in the vicinity of a spectral hole, a sharp positive transmission peak is observed on a broad background of partial transmission.

The use of persistent spectral hole burning for laser frequency stabilization is shown in FIG. 3. In laser frequency stabilization using persistent spectral hole burning, a Fabry-Perot cavity is eliminated from the stabilization system and instead a beam is transmitted through a persistent spectral hole burning material (SHBM). The output of a tunable laser 110 on path 360 is split at a beam splitter 320 before entering the modulator 112 along path 361. The modulator uses an input rf signal to modulate the laser output, as in FIG. 1A. The output from the modulator is directed along path 362 through a persistent SHBM 310. The persistent SHBM includes a persistent spectral hole that is at a desired output frequency in a narrow spectral width. The output from the persistent SHBM 310 is used as a reference beam, which is detected by the detector 120 which is like the detector 120 of FIG. 1A. In the case that the spectral hole burning materials are gated burning hole materials, the laser 120 does not cause any permanent change unless some other control conditions simultaneously exist, such as a control field generator 370. Over time, repeated hole burning in a persistent spectral hole burning material while frequency locking will cause the spectral holes to saturate and broaden, degrading lock stability. Further, there are relatively few persistent spectral hole burning materials.

It is known how to lock a mode-locked pulsed laser with a spectrum shown in FIG. 13, simultaneously to a large number (e.g 500,000) of adjacent longitudinal modes of a Fabry-Perot cavity to stabilize the frequency, phase, and repetition rate of its pulse train, as shown in FIG. 14. The crucial requirement is that all the error signals generated from all the reference cavity modes and all the pulsed laser modes (in one single laser beam and after being passed through the modulator are each individually phase-modulated with their own set of sidebands) be adjusted to constructively add to form a total error signal that looks nearly identical to the error signal for a single frequency laser. The error signal may then be applied through a servo amplifier to the appropriate tuning elements of the mode-locked laser, such as but not limited to: a piezoelectrically mounted mirror to vary the cavity length and a piezoelectrically controlled dispersive element such as a prism or tilting mirror to manage this dispersion. There are two principal difficulties in doing so: a) the mode spacings must match, and b) the absolute frequency of each spectral component in each comb must be aligned to overlap by tuning the laser pulse train spectrum to match those set by the Fabry-Perot reference cavity. This can only be done approximately when locking to a Fabry-Perot reference cavity. The time-domain pulse repetition of the mode-locked laser is very steady except for thermal drift of the laser cavity; this gives rise in the Fourier transformed frequency spectrum to a comb of extremely uniformly spaced modes. However, the mode spacings of the Fabry-Perot cavity do not nearly approach this uniformity. While they are all nominally spaced by the inverse of the round trip time for light traversing the cavity, dispersion (or variation with frequency) compresses or expands the mode spacings in the outer reaches of the reference cavity mode spectrum because the group velocity dispersion of the mirrors varies the optical path length of the cavity for the widely different frequency components. Hence, only some central modes are exactly overlapped and those much further away accrue an increasing degree of frequency mismatch. The composite error signal suffers to some degree from the mismatch.

The frequency locking achievable using Fabry-Perot cavities, as shown in FIG. 1A, is limited by the thermal length changes, mechanical creep, vibration and other variations in the length of the reference cavity influenced by external causes. The frequency locking achievable using atomic transitions are limited by available central frequencies associated with those transitions and the characteristics of the frequency reference such as the Lamb dip. The frequency locking achievable using persistent spectral hole burning materials is limited by the broadening of the spectral hole and the range of materials that can be used as the persistent spectral hole burning material. There is a need for a laser frequency stabilization technique providing better stabilization using a frequency reference with a consistently narrow bandwidth. There is also the need for a spectral hole burning technique to stabilize the frequency of a laser with many different material options for the spectral hole burning material.

SUMMARY OF THE INVENTION

An object of the present invention is to link together existing techniques of frequency locking and transient spectral hole burning to more accurately stabilize the frequency of a laser. Another object of the present invention is to use transient spectral hole burning materials as both laser stabilizers and signal processors.

The present invention relates to a device for actively stabilizing the frequency of a laser by locking to a transient spectral hole in a solid state reference material. A transient spectral hole may naturally have a lifetime up to a few tens of milliseconds. However, as long as the laser is continuously illuminating the transient spectral hole material and is stabilized to the center frequency of the hole, the spectral hole is continuously renewed, providing and maintaining a stabilizing reference. Many more materials exhibit transient spectral hole burning than do persistent spectral hole burning, giving an access to a greater range of available frequencies at which lasers can be stabilized. As a high level stabilization is achieved on millisecond time scales, the stabilization is ideal for providing sources for coherent transient effects, in particular, the photon echo and stimulated photon echo phenomenas that are the basis for a wide range of optical processors.

Techniques for stabilizing a laser at a selectable frequency include splitting an output beam from an electrically adjustable laser into a first beam and a second beam. The second beam is transmitted through a modulator to produce a modulated second beam. Then the modulated second beam is transmitted through a transient spectral hole burning material onto a detector. The laser is electrically adjusted in response to a detector output from the detector which senses the changes in the modulated second beam after it passes through the transient spectral hole burning material.

The transient hole burning frequency stabilizer has particular applications in devices that require extreme frequency stabilization on relatively brief time scales. This includes, but is not limited to, other devices based on the time and frequency-domain spectral hole burning, such as optical signal routers and switches, processors, correlators, true time delay generators, rf spectrum analyzers, and for high resolution spectroscopy.

Other applications include portable and transportable frequency references, precision laser ranging and long baseline interferometery, a high quality local oscillator component in frequency standard or clock system that provides an accurate absolute time and frequency reference for applications, a stabilization component in a frequency comb system or other frequency synthesizer, laser frequency and time standards for use in space for example to synchronize or control the positions of satellite networks, local oscillators for coherent communications, synchronization for advanced generations of telecommunications networks, optical source for quantum computation, and optical source for quantum-limited measurements on atoms.

Additional objects, advantages and novel features of the invention will be set forth in part in the description which follows, and in part will become apparent to those skilled in the art upon examination of the following or may be learned by practice of the invention.

BRIEF DESCRIPTION OF THE DRAWINGS

The present invention will be described in an illustrative sense and not by way of limitation with respect to the drawings in which the same elements have the same item number, and in which.

DETAILED DESCRIPTION OF THE INVENTION

Figure 1A:
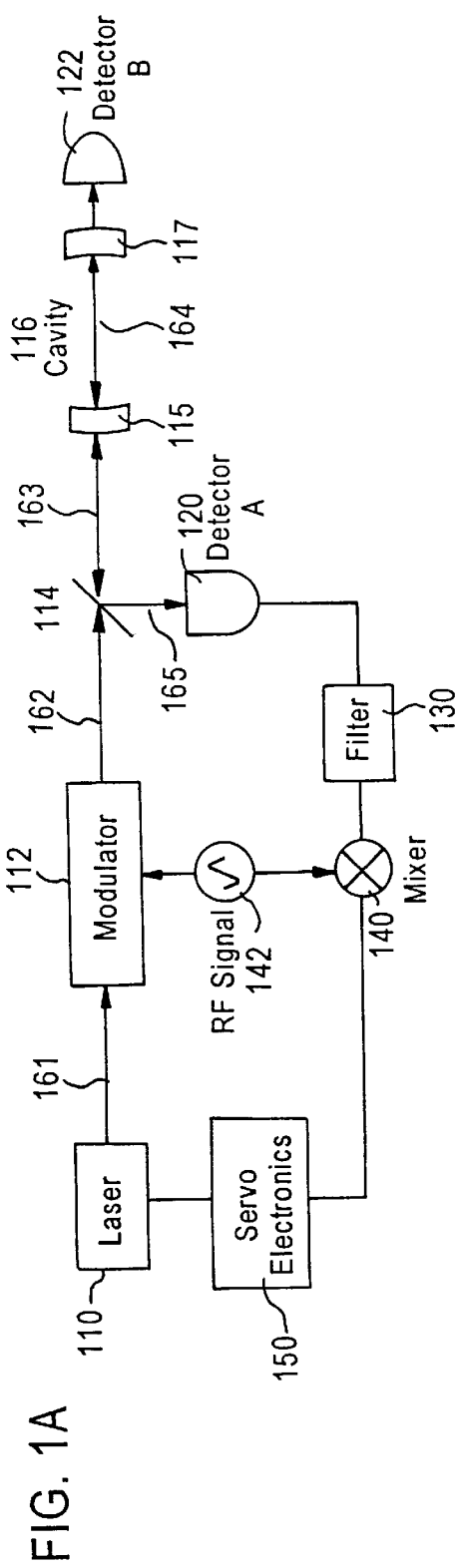
FIG. 1A is a block diagram of a prior art apparatus for stabilizing the frequency of a laser.
Figure 1B:
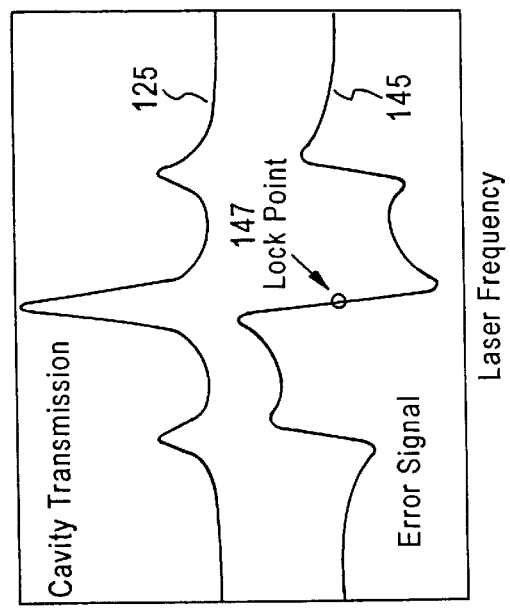
FIG. 1B is a graph of the output of a cavity transmission detector and an error signal output by an error signal detector combined with a mixer from the apparatus of FIG. 1A.
Figure 2A:
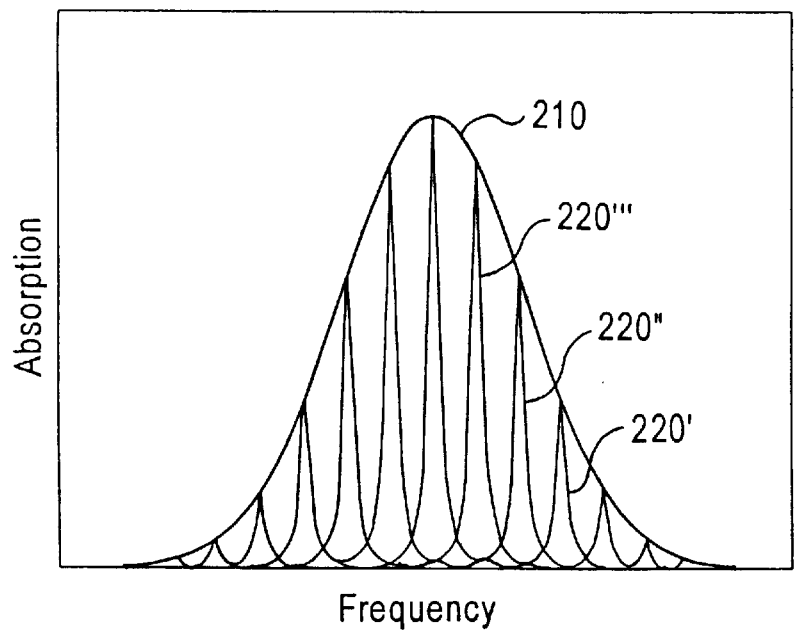
FIGS. 2A and 2B are graphical representations demonstrating the overlap of homogeneous lines giving an inhomogeneous line broadening in a SHBM and a spectral hole resulting from removal of a subset of ions or molecules by a narrow-band laser.
Figure 2B:
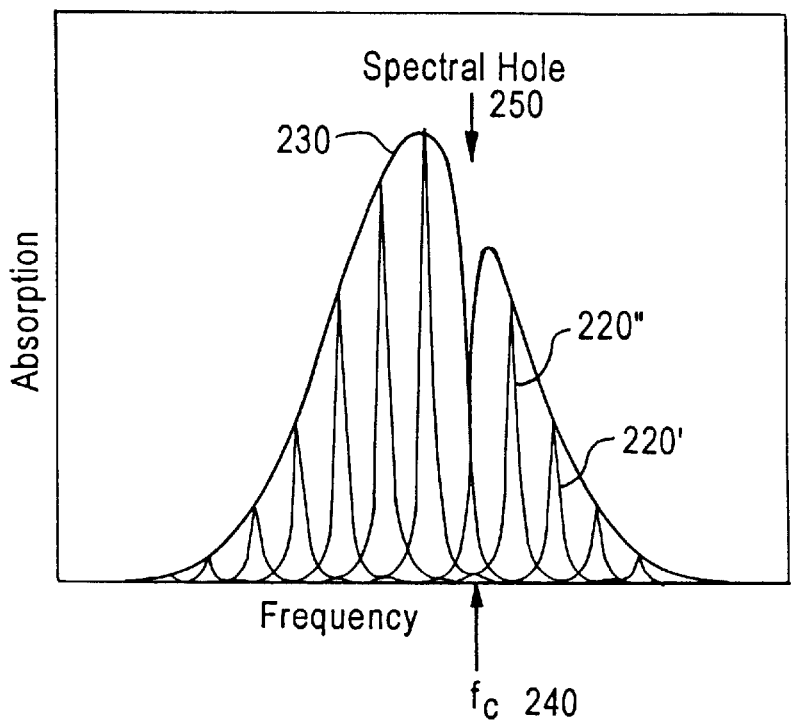
Figure 3:
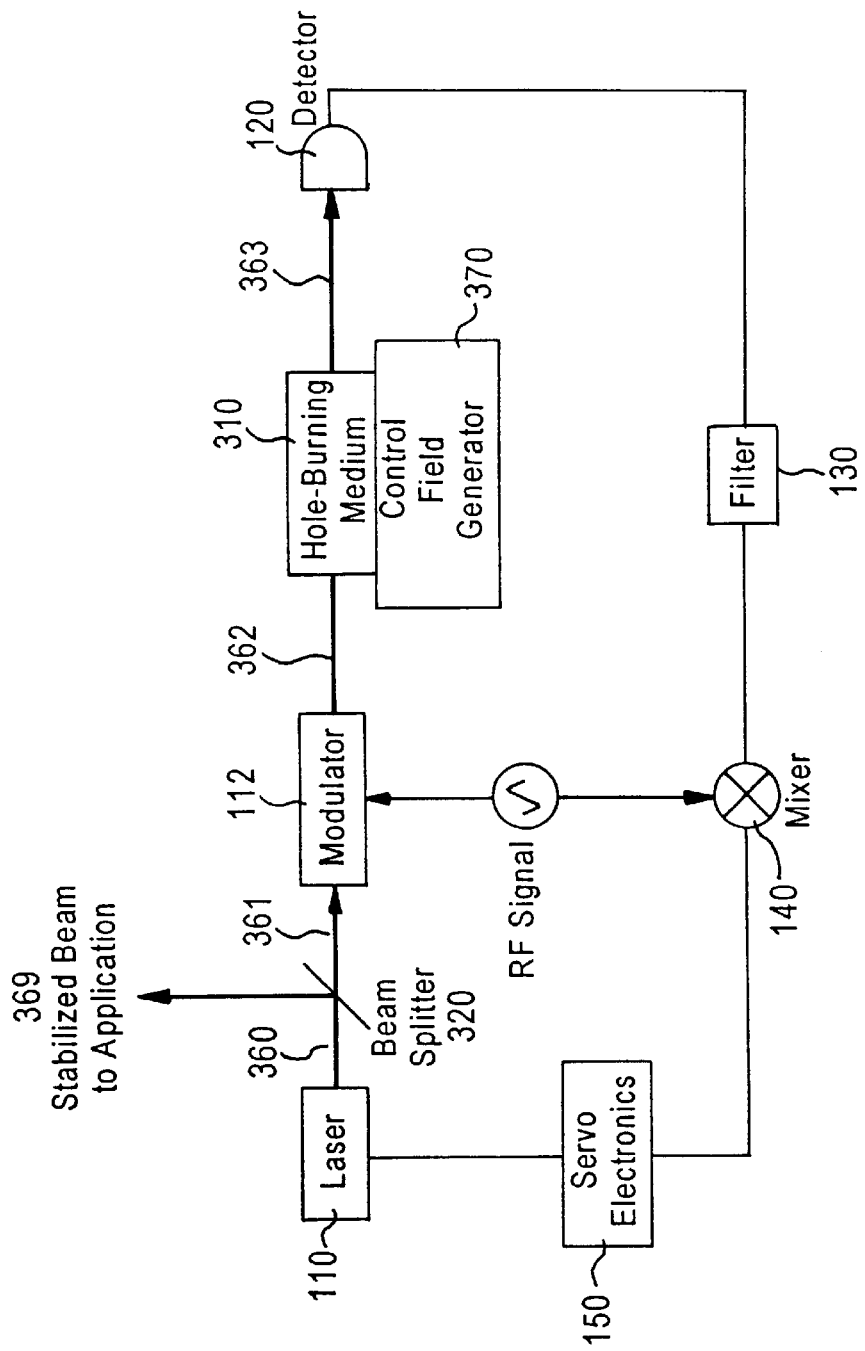
FIG. 3 is a block diagram of an apparatus for locking to a spectral hole according to one embodiment of the present invention.
Figure 4:
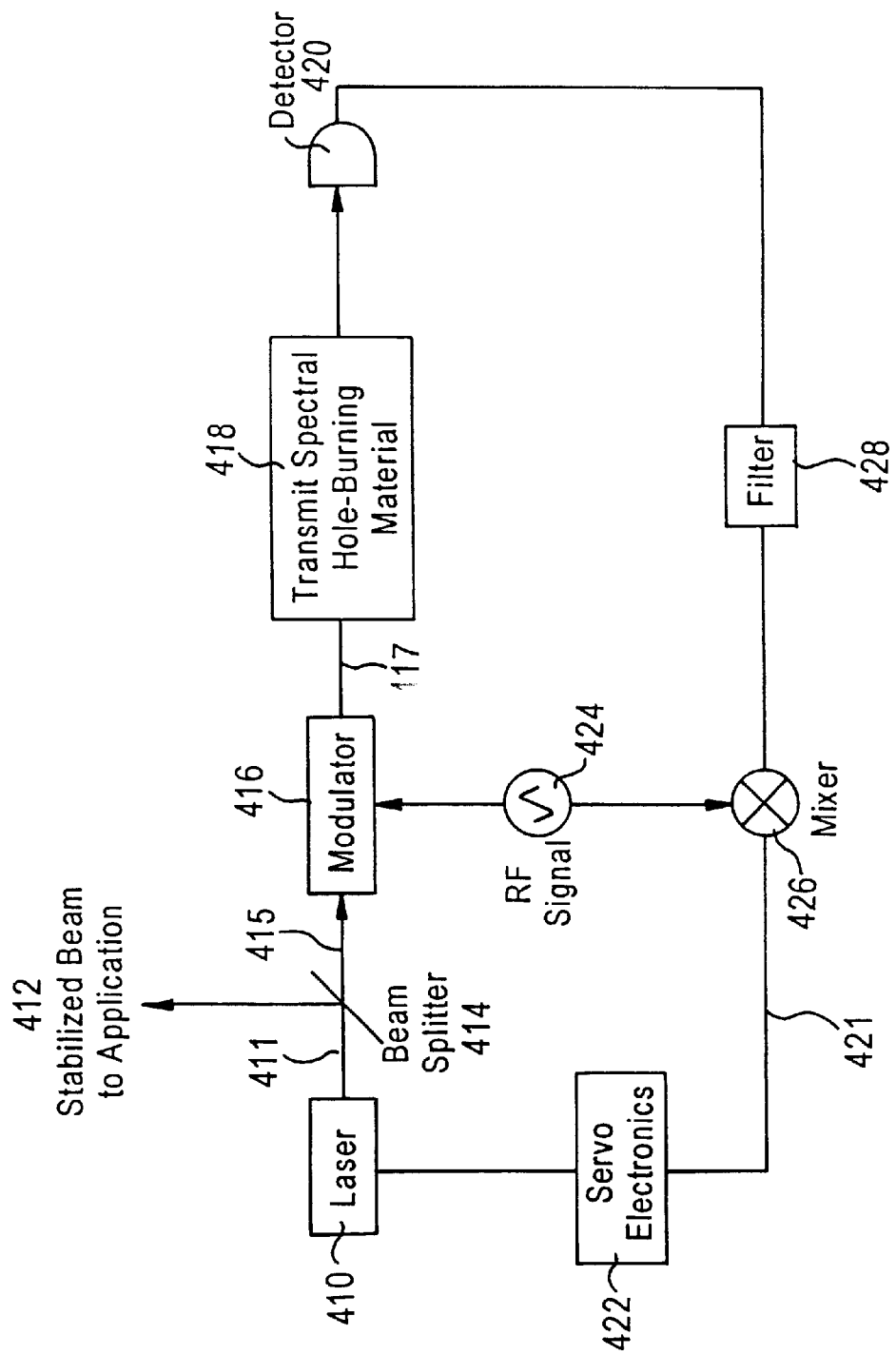
FIG. 4 is a block diagram of an apparatus for stabilizing the frequency of a laser of the present invention.

In the preferred embodiment, shown in FIG. 4, transient spectral hole burning material (SHBM) is used to stabilize a laser. The output of the tunable laser 410 on path 411 is split at a beam splitter 414 before entering the modulator 416 along path 415. The modulator uses an input rf signal to modulate the laser output. The output from the modulator is directed along path 417 through a transient spectral hole burning material 418. The output from the transient spectral hole burning material 418 is a reference beam which is detected by a detector 420. The detector 420 outputs a detector electrical signal. The detector signal is filtered at filter 428 to remove unwanted harmonic frequencies and to generate an error signal that is output to the mixer 426. At the mixer 426, the rf signal from the rf signal generator 424 is combined with the error signal at rf frequencies to demodulate the error signal to low frequencies where it is used as a control signal 421 that is output to the laser servo electronics 422. The servo electronics 422 tune the laser 410 in response to the control signal 421 received.

Servo electronics are built in any manner known in the art to take the error signal derived from the transmission of the modulated laser through the transient SHBM and provide corrections to the laser tuning elements to lock the laser frequency. In the preferred embodiment, the principal elements are two consecutive operational amplifiers, which are configured as lead-compensated integrators, to convert the time-dependent error signal into a corrective voltage. A corner frequency of the first lead compensated integrator was chosen to be approximately one-half of the frequency width of the spectral hole chosen for locking. A corner frequency of the second lead compensated integrator was chosen experimentally to best narrow the laser frequency. The second corner frequency optimizes the relative amounts of control feedback at lower frequencies versus control feedback at higher frequencies and is chosen to minimize the error signal while locked.

In one embodiment of the present invention, spectral hole burning is used for laser frequency stabilization using regenerative transient spectral hole burning. As long as the laser illuminates the transient SHBM and remains stabilized to the center frequency of the spectral hole, the spectral hole is continuously regenerated and provides a stabilizing reference at an arbitrary location in the absorption profile. The use of a transient SHBM provides excellent short term stability in a tunable laser, which is the most important requirement for many applications. For example, the $10^{-2}$–$10^{3}$s time scale in which optimum stability occurs, for this realization, is an ideal range for laser ranging and long baseline interferometry. Since far more condensed phase systems exhibit transient spectral hole burning than exhibit persistent spectral hole burning, this strategy gives access to a far greater range of frequencies. Many materials have hole lifetimes of a few tens of milliseconds or longer and a stable feedback loop can result in stabilization of the frequency over substantially longer intervals. Stability is derived from both the lifetime of the hole and its cumulative memory, in contrast with the technique of using delayed self-heterodyne detection to stabilize a laser to instantaneous samples of its recent history. The utility of this stabilization technique for spectroscopy and time-domain spectral hole burning devices is dramatically expanded since an identical piece of material used for the device naturally provides suitable stabilization at the wavelength already being used for spectroscopy and the time domain spectral hole burning devices. This class of applications includes, but is not limited to, devices based on the time and frequency-domain spectral hole burning, such as optical signal routers and switches, processors, correlators, true time delay generators, rf spectrum analyzers.

Transient spectral hole burning may be achieved by a number of storage mechanisms. The most common is population storage in the excited states of an optically active ion or molecule, providing lifetimes of up to several tens of milliseconds. Population storage in hyperfine components of the ground state can provide even longer lifetimes, up to hours or days. An ion migration mechanism has recently been shown to produce spectral hole burning with lifetimes ranging from tens of seconds to indefinite persistence. The balance between spontaneous hole decay and further hole burning from continued illumination determines the equilibrium depth of a transient hole. The unstabilized laser initially burns a jitter-broadened spectral hole. However, the laser frequency stabilizes to a fraction of the hole width, and the hole narrows to a limit set by the homogeneous linewidth and the laser irradiance. This differs markedly from persistent spectral hole burning where the hole can burn deeper and broader with continued locking with little or no recovery by hole relaxation.

The presence of a sharp spectral hole in the absorption implies a sharp dispersion in the refractive index. The Pound-Drever-Hall locking technique is used with a modulation frequency greatly exceeding the spectral hole resonance width to provide a feedback error signal proportional to the dispersion in the refractive index.

For example, this stabilization technique uses the $^3H_6 \rightarrow {}^3H_4$ transition in $Tm^{3+}:Y_3Al_5O_{12}$ ($Tm^{3+}:YAG$) at 793 nm. Fluorescence decay time of the upper state of this material is about 620 $\mu$s at 1.9K. Decay to the intermediate $^3F_4$ state, with a much longer fluorescence lifetime of about 12 ms, occurs with a calculated branching ratio of about 0.54 and greatly enhances the spectral hole burning time scales available. The splittings of the $Tm^{3+}$ ground state due to interaction with the neighboring $Al^{3+}$ nuclear spins provide a third population storage mechanism with an even longer storage time. The potential for spectroscopy and time-domain spectral hole burning devices is illustrated by a stimulated photon echo measurement on the same transition as used for locking.

An exemplary SHBM is $Tm^{3+}:YAG$ crystals with $Tm^{3+}$ concentrations of 0.1 at. %, giving a peak absorption coefficient of 1.5 $cm^{-1}$ for the $^3H_6(1) \rightarrow {}^3H_4(1)$ transition, and an inhomogeneous linewidth of 20 GHz. Exemplary crystal thicknesses are 5.1 mm and 5.3 mm for locking and 3.5 mm for photon echo measurement. The homogeneous linewidth of the transition is determined from the Mims dephasing time $T_M$ of a two-pulse photon echo; a typical value is 75 $\mu$s in the absence of an applied magnetic field. In more dilute samples, a typical value of $T_M$ is 116 $\mu$s, corresponding to a homogeneous line width of 4 kHz. The line width of a shallow spectral hole burned by a narrow-band laser is double this and becomes broader if the holes are burned deeper, due to less saturation in the wings than at the center.

As an example, two GaAlAs external cavity diode lasers can be independently frequency stabilized to transient spectral holes in separate $Tm^{3+}$:YAG crystals. A single cryostat held both crystals immersed in a superfluid helium bath at 1.9K. External phase modulation at 23 and 25 MHz respectively produced frequency side-bands with a modulation index of 0.22. The relative frequency stability of the two lasers is measured by heterodyne detection of unmodulated portions of the beams. Exemplary beam diameters are approximately 1 mm, with an exemplary irradiance of 2.3 $mW/cm^2$. There can be a strong variation in the locking stability as the beam power is adjusted to achieve the optimum balance the irradiance required to optimize the equilibrium hole depth for locking, trading off the depth and width of the spectral hole.

Figure 5:
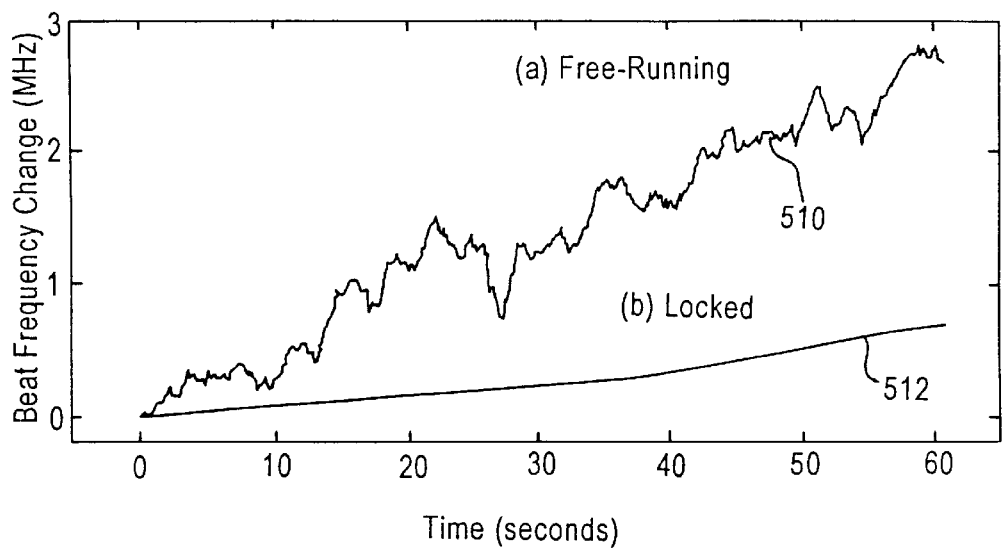
FIG. 5 is a graphical representation of two pairs of lasers producing heterodyne beat signals.

An example of the evolution of a heterodyne beat frequency is shown in FIG. 5 for cases when both lasers were free running 510 or both locked 512. The heterodyne beat frequency of the two locked lasers 512 is clearly more stable than the heterodyne beat frequency of the two free running lasers 510. It is on time scales of fractions of a second to tens of seconds that the most significant stabilization occurs in this realization, as shown by the smoothness of the locked curve lasers 512. The major sources of instability are residual amplitude modulation causing voltage offsets upon mixing down to lower servo frequencies and thermally induced offsets and drift in the locking circuitry. These offsets typically corrupt the error-signal reference voltage and cause the laser frequency to lock slightly off the center of the hole. The frequency of the hole then gradually drifts as burning occurs at the shifted lock frequency. The exemplary servo amplifier is adjusted to passively null the offset voltage at the start, but later fluctuations are typically uncompensated. The drift rate will typically vary and change directions on time scales of minutes due to sensitivity to environmental changes. The exemplary stabilization is obtained without temperature stabilizing the electronics or optical setup and with only the vibration isolation provided by a standard pneumatically floated optical table. The exemplary implementation with 20 Hz stabilization over 10 milliseconds with a 8 kHz resonance, is not limited by any material properties, nor are there fundamental obstacles to reaching milliHertz levels.

Similar levels of performance have been achieved in $Er^{3+}$ doped crystal materials operating in the important 1.5 micron communications band; these include $Er^{3+}$:$Y_2SiO_5$, $Er^{3+}$:$KTiOPO_4$ (KTP), and $Er^{3+}$:$LiYF_4$. Several dozen $Tm^{3+}$, $Er^{3+}$, $Pr^{3+}$, and $Tb^{3+}$ spectral hole burning materials have been characterized for time domain spectral hole burning applications and all of these are well suited to locking to transient spectral holes. The first requirement is narrow spectral holes with an appropriate lifetime. The $Er^{3+}$:$Y_2SiO_5$, for example, has a homogeneous linewidth of 78 Hz. The second desired feature is a broad inhomogeneous line width for maximal flexibility in frequency selection. Literally dozens to hundreds of similar oxide, fluoride, and other inorganic salts doped a variety of rare earth or transition metal ions will also be suitable. For less demanding applications, rare earth or transition metal ion doped glasses will also be suitable.

With the high level of frequency stabilization achieved on millisecond time-scales, this stabilization strategy provides ideal laser sources for optical coherent transient phenomena, in particular the photon echo and stimulated photon echo that are the basis for time-domain spectroscopy and optical devices. For optimal exploitation of the stimulated photon echo, laser frequency stability is required for the storage time of the material. Since this storage time is the lifetime of a transient spectral hole for the transition being probed, the requirement is naturally met by locking to a spectral hole.

Figure 6:
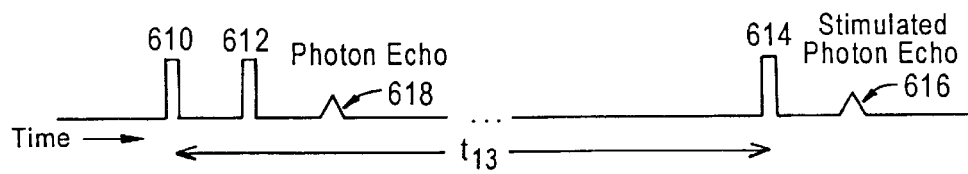
FIG. 6 is a schematic illustration of a photon echo and stimulated photon echo phenomena.

The underlying physical principle behind time-domain spectral hole burning devices is the photon echo. As shown in FIG. 6, two brief pulses of light 610, 612 are transmitted through a crystal and a third pulse 614 is emitted from the crystal at a particular time and in a particular spatial direction. An extension of this, and the most common implementation for devices, is the stimulated photon echo 616 where the photon echo 618 created by the transmission of the first two pulses 610, 612 is read out some time later by the transmission of a third pulse 614. The stimulated photon echo 616 is only created if all three applied pulses 610, 612 and 614 are present and if they all have the same frequency within a suitable tolerance.

As a simple example of the processing capabilities of this phenomenon, pulse 612 can be replaced with a stream of pulses representing data. A separate stimulated photon echo is then created for each pulse in the data stream, with the result that the data stream is recreated after pulse 614. More complex processing can be implemented by also replacing pulses 610 and 614 with pulse streams, and by varying the angles at which the pulses are incident on the SHBM.

The efficiency of the stimulated photon echo 616 depends on both fundamental dephasing and decay processes, and on the frequency stability of the laser during the entire pulse sequence. Since the third pulse 614 must be at the same frequency as the first two 610 and 612 in order to produce a stimulated echo 616, the maximum time between the first pulse 610 and third pulse 614 has been traditionally limited by the frequency stability of the laser. By improving the frequency stability of the laser this limiting factor is removed. Instead, the fundamental decay processes of the optical resonance become the limit. In favorable materials exhibiting transient spectral hole burning, the fundamental decay processes are typically limited to several tens of milliseconds.

Figure 7:
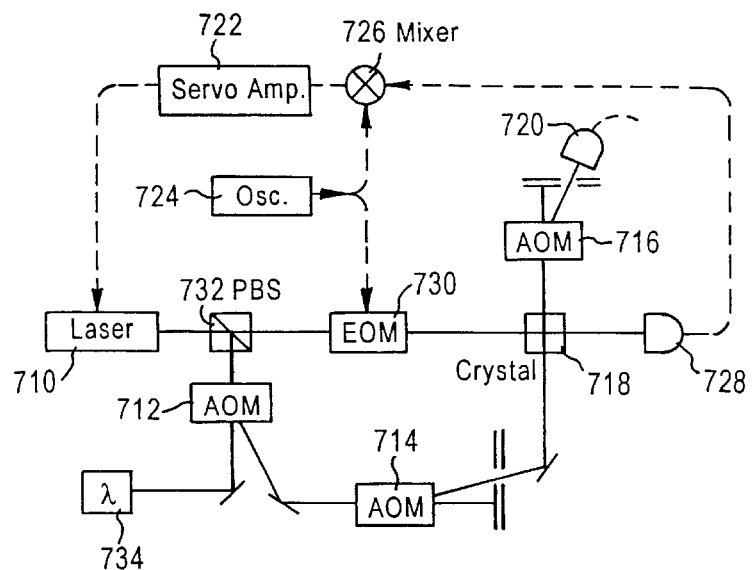
FIG. 7 is a block diagram for an apparatus for measuring a stimulated photon echo.

For example, frequency stabilization potential in optical devices is exemplified by measuring stimulated photon echoes on the $^3H_6 \rightarrow ^3H_4$ transition of $Tm^{3+}$:YAG using a frequency-stabilized laser, as shown in FIG. 7. An exemplary 1 mW of unmodulated continuous-wave power produces echo excitation pulses after a portion of the laser output was modulated and used to frequency-lock the laser 710 to a regenerative transient spectral hole. The exemplary pulses are produced by two acousto-optic modulators 712, 714, used in series to improve the on/off contrast ratio, with a third 716 used after the crystal 718 to block the excitation pulses. The photon echoes were detected with a thermoelectrically cooled photomultiplier 720. Three exemplary 1.5 pus excitation pulses were incident on the sample, with a delay between the first 610 and second pulses 612 of 6 $\mu$s. The stimulated photon echo was measured as a function of the delay between the second 612 and third pulses 614.

Figure 8:
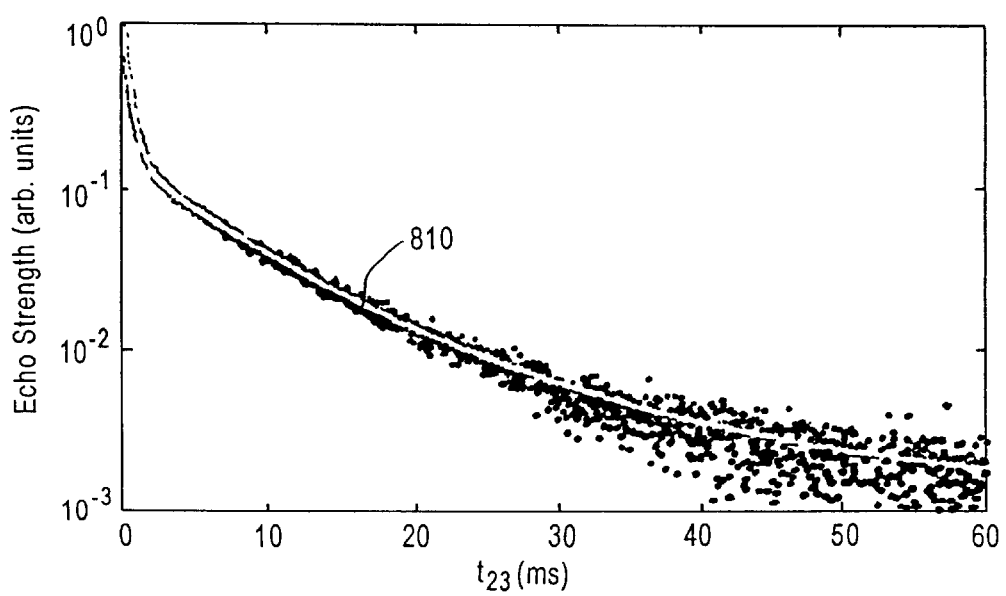
FIG. 8 is a graphical representation of a stimulated photon echo decay.
Figure 9:
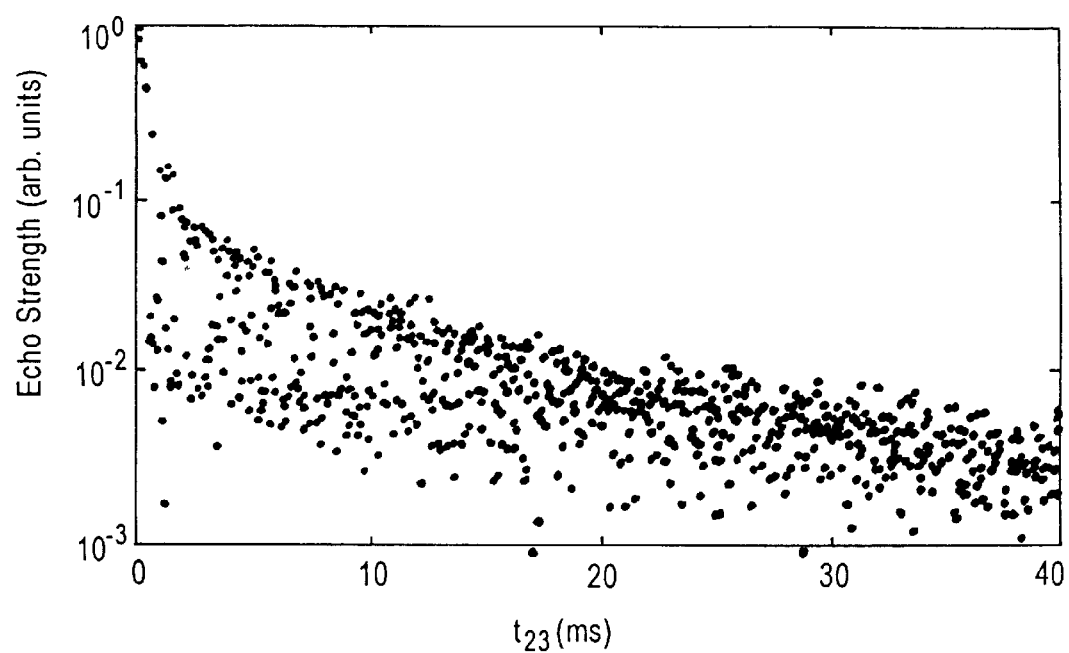
FIG. 9 is a graphical representation of a stimulated photon echo decay for a laser without frequency stabilization.

In this example, when the laser frequency was locked to a transient spectral hole and photon echoes could be measured consistently for delay times between the second pulse 612 and third pulse 614 for several tens of milliseconds. As shown in FIG. 8, the limiting factor for measuring echoes with longer time delays is the detector signal-to-noise ratio, rather than laser frequency jitter. In contrast, when the stimulated echo decay is measured with the laser free-running, the reproducibility of the stimulated echo became unreliable after only 500 µs, as shown in FIG. 9. All the data points of FIG. 8 and FIG. 9 are single-shot acquisitions of the stimulated photon echo 616 without thresholding to reject low-intensity echoes. In FIG. 9 it is clear that frequency jitter was the cause of the echo signal amplitude fluctuations, since occasionally a true-valued echo 616 was produced when the laser frequency of the third pulse 614 happened to match that of the first two 610 and 612. An envelope of true-valued echoes can be seen, but most points fall well below this.

The generation of a stimulated photon echo 616 can be considered as the scattering of the excitation pulse off the population grating generated by the first two pulses 610 and 612. The first two pulses 610, 612 create a modulation in the population of the excited state as a function of frequency, and a corresponding depletion in the ground state. The electric field vector of the echo stimulated 616 by the excitation pulse 614 is proportional to the sum of these two gratings as they exist at the time of the excitation pulse 614. Intermediate state populations do not contribute directly to the echo but allow the ground state depletion to remain for longer than the lifetime of the upper state. A rate equation analysis for a four-level system shows that the echo electric field decays with increasing delay time as the sum of three exponential functions whose decay times are the lifetimes of the three excited states involved. The detected echo strength is the square of this function.

The square root of the echo intensity was fitted to three exponentials giving the solid white line 810 in FIG. 8 with decay times of 590 µs, 11.8 ms, and 90 ms. The first decay time corresponds to population storage in the $^3H_4$ excited state of the transition, in agreement with the 620 µs value obtained from fluorescence decay at 2 K in the same crystal. The second corresponds to population storage in the intermediate $^3F_4$ metastable state, a mechanism previously shown to account for transient spectral hole burning in $Tm^{3+}$ doped crystals. The third, longest decay component has an uncertainty of about 50% for its decay time due to the scatter of the data attributed to detector noise. This component is assigned to an energy shift arising from the coupling of $Tm^{3+}$ to the nuclear spins of lattice $Al^{3+}$ ions. To confirm the nuclear-spin coupling contribution to the population storage, the stimulated echo decay was remeasured with a permanent magnet placed immediately beneath the cryostat. This produced a very modest magnetic field at the crystal, but it was enough to show a distinct increase of the decay time associated with this level structure, corresponding to increased spin-lattice relaxation times.

Figure 10:
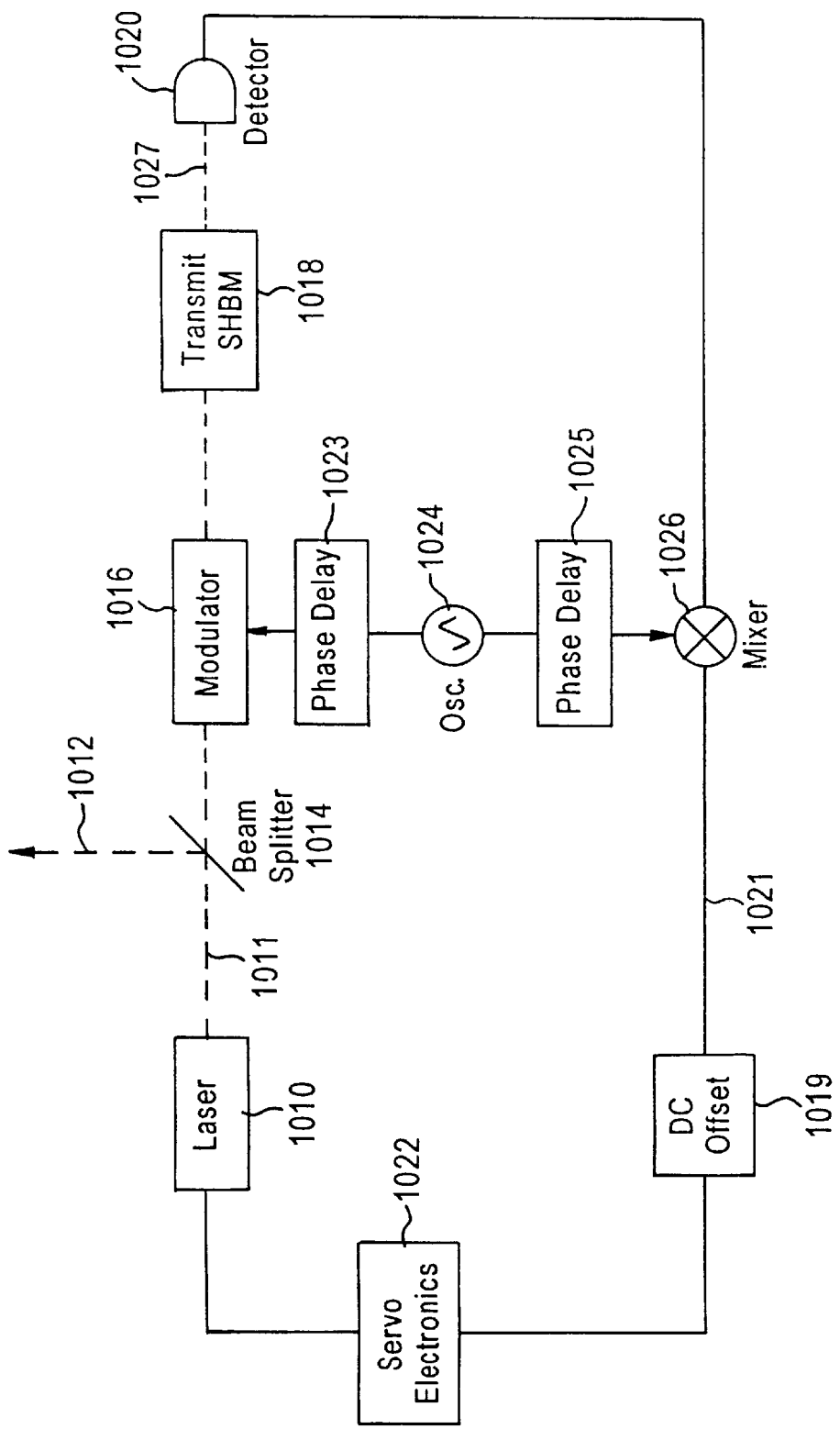
FIG. 10 is a block diagram for an apparatus for stabilizing a laser using a spectral hole and inhomogeneous absorption line.
Figure 11:
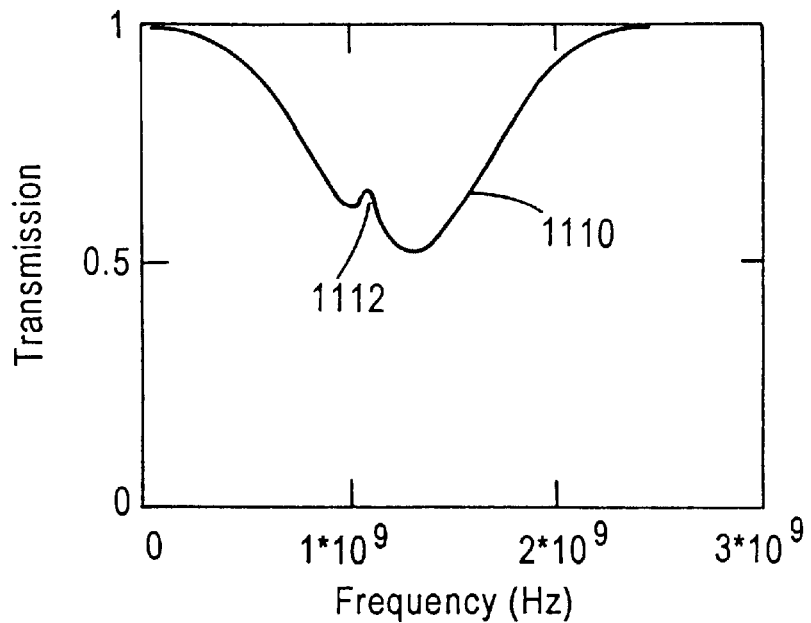
FIG. 11 is a graph of the light transmitted from a transient spectral hole burning material.
Figure 12:
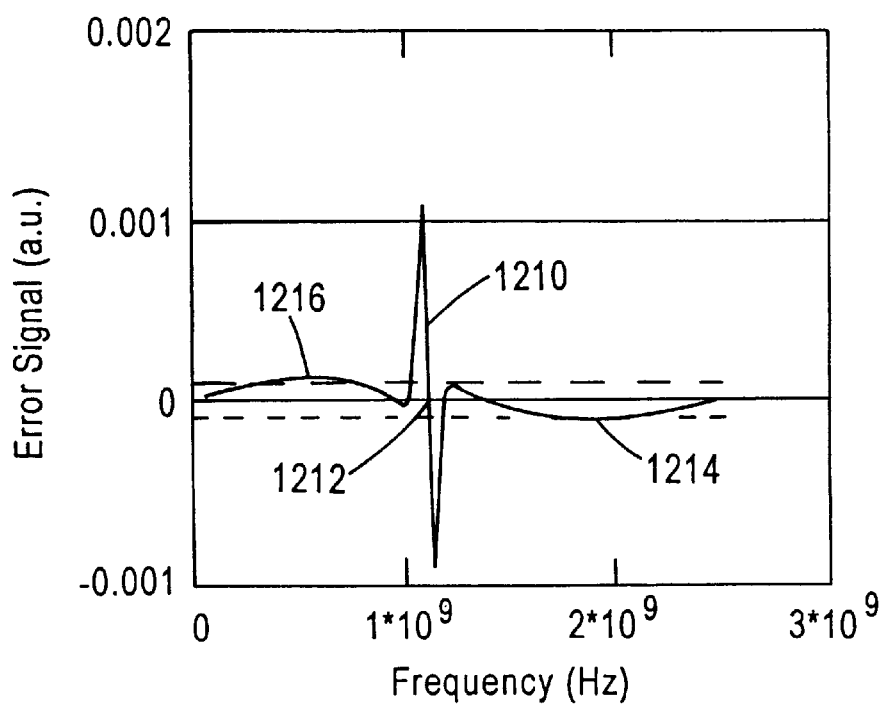
FIG. 12 is a graph of an error signal with a phase delay.
Figure 13A:
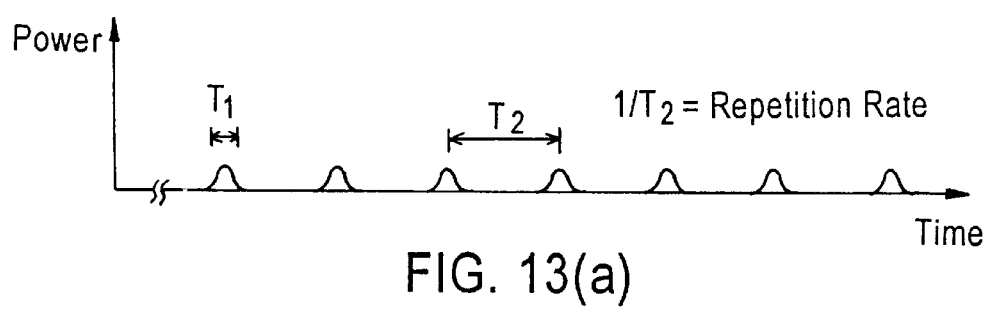
FIG. 13a is an graphical representation of an emitted pulse train of equally spaced optical pulses from a mode-locked laser.
Figure 13B:
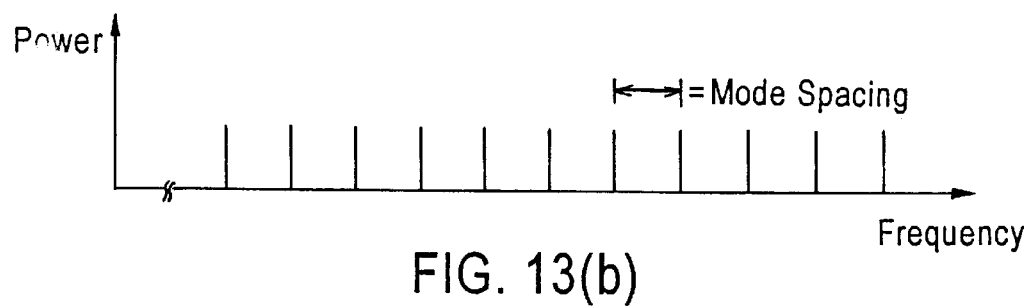
FIG. 13b is a graphic representation of a Fourier transform of the time domain pulse train in terms of frequency.
Figure 14A:
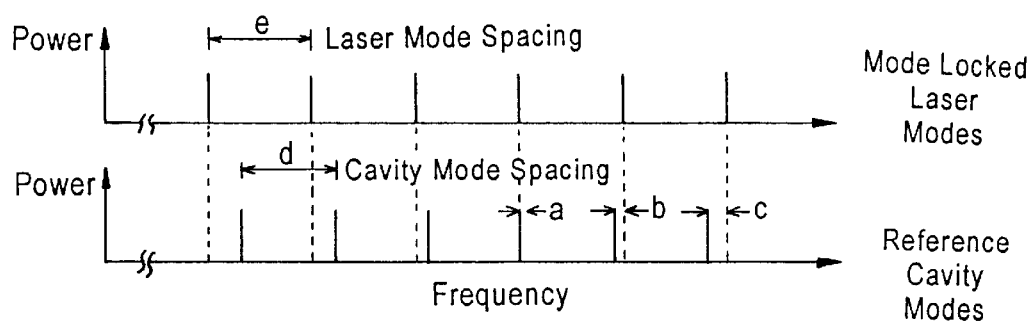
FIG. 14a is a graphical representation of the mismatch of a mode-locked laser modes and the modes of a reference Fabry-Perot cavity.
Figure 14B:
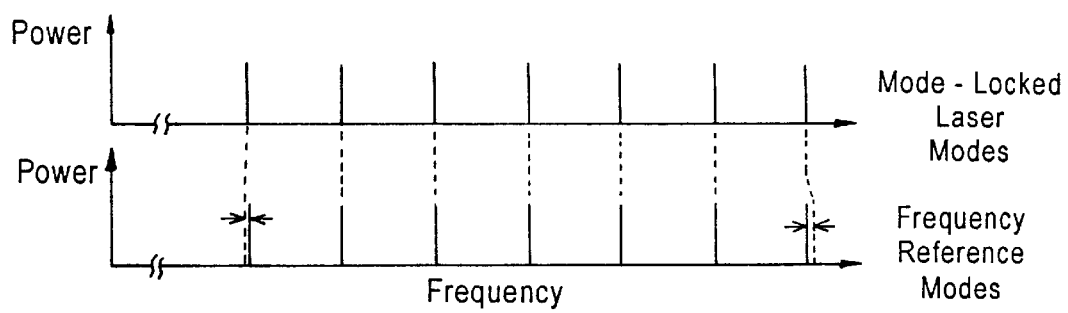
FIG. 14b is a graphical representation of stabilized mode-locked laser modes that do match cavity modes, except for dispersion at far ends of the spectrum.

Absolute frequency stabilization may be added by combining the above described stabilization using the error signal from a narrow transient hole with error signal contributions from the overall inhomogeneous lineshape. This combines the short term stabilization with a capability to reduce frequency drift. Locking can be achieved at an arbitrary point in the inhomogeneous line using this hybrid method. FIG. 10 shows a similar embodiment to the embodiment of FIG. 4 with the addition of phase delay mechanisms and a DC offset mechanism. The phase delay mechanisms 1023, 1024 between the modulator 1016 and mixer 1026 provide additional control of the laser 1010 locked to a transient spectral hole, preventing the transient spectral hole from gradually drifting. Laser beam 1027 is transmitted out from the transient SHBM, detected by the detector 1020. FIG. 11 shows a plot of the typical transmission spectrum of the laser beam 1027. The broadband Gaussian absorption 1110 is attributed to the inhomogeneous absorption line. The narrow band of light 1112 is attributed to a transient spectral hole in the transient SHBM 1018. The phase delay between the modulator 1016 and the mixer 1026, of FIG. 10, can be tuned such that frequency components of both the inhomogeneous absorption curve 1110 and the transient spectral hole 1112 are present in the electrical signal output from the mixer 1026 and input into the servo electronics. This selects a phase quadrature that is intermediate between either of the two quadratures normally chosen in frequency modulation spectroscopy. A typical electrical signal output from the mixer 1026 is shown in FIG. 12. FIG. 12, the zero crossing 1212 is used as feedback to the servo electronics 1022 to stabilize the laser; the zero crossing 1212 has components of both the transient spectral hole frequency 1210 and the inhomogeneous absorption line frequency 1214 and 1216. Further, the DC offset mechanism 1019 of FIG. 10 or of the relative phase delays 1023 and 1025, can be used to tune the frequency at which the laser 1010 operates. The DC offset mechanism 1019, by translating the error signal intensity, shifts the frequency of the zero-crossing 1212 of the error signal which the servo electronics 1022 utilize as a feedback for stabilizing the laser 1010. Adjustment of the phase delays 1023 and 1025 can control the slope of the new inhomogeneous line contribution at the new zero crossing. Hence, adjustment of the DC offset mechanism 1019 or of the relative phase delays 1023 and 1025 can effectively tune the laser 1010 to a desired frequency. The transient spectral hole used for locking gradually adjusts to its position to provide stabilization at the new equilibrium locking frequency. This hybrid stabilization method is more applicable when the modulation frequency is on the order of the inhomogeneous absorption linewidth. In materials like $Er^{3+}:Y_2SiO_5$, even with a modulation frequency of 30 MHz and an inhomogeneous linewidth of 500 MHz, the technique provides longer term stabilization. The foregoing description has been one particular illustration of the embodiment. Other hybrid schemes to provide stabilization with transient spectral hole error signals in combination with locking to separate atomic lines or Fabry-Perot cavities or other fixed frequency references may be envisioned.

Figure 15A:
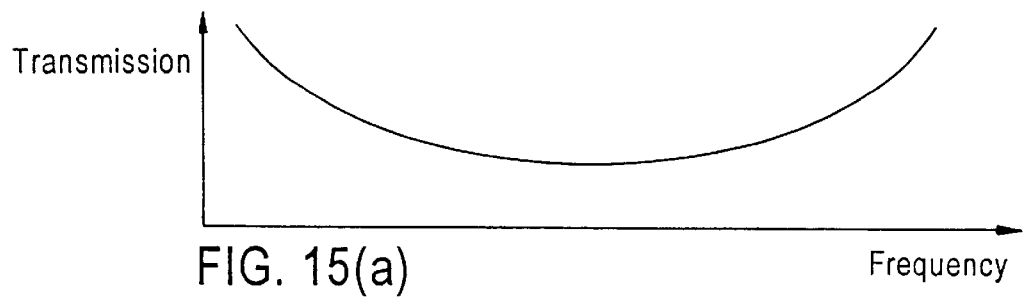
FIG. 15*a* is a graphical representation of an inhomogeneous absorption line.
Figure 15B:
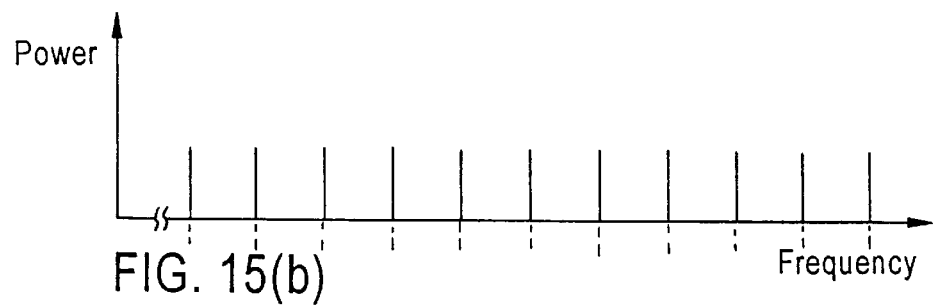
FIG. 15*b* is a graphical representation of the modes of a mode locked laser.
Figure 15C:
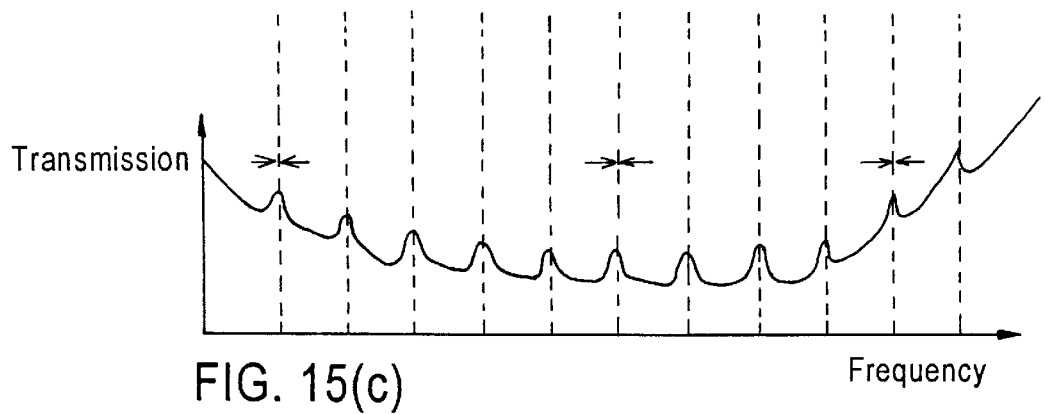
FIG. 15*c* is a graphical representation of the spectral holes formed where the laser modes are without a frequency mismatch.
Figure 16A:
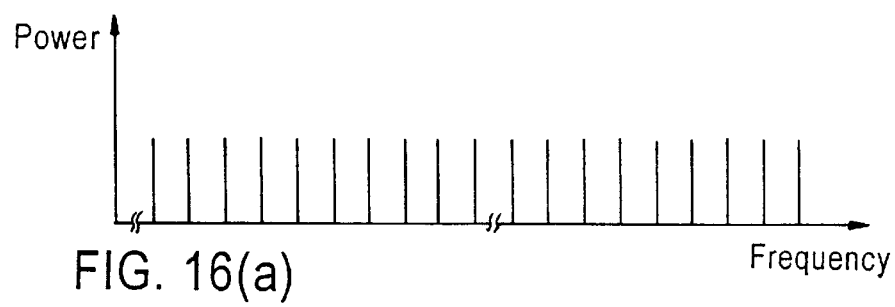
FIG. 16*a* is a graphic representation of a mode-locked laser spectrum.
Figure 16B:
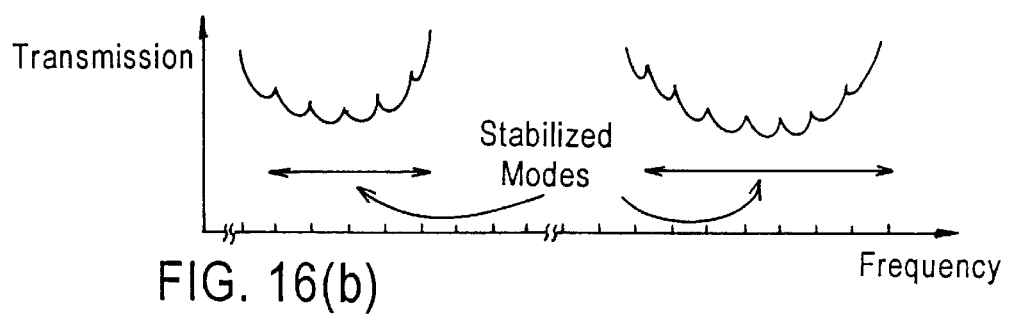
FIG. 16*b* is a graphical representation of spectral holes in multiple inhomogeneous absorption lines.

In another embodiment of the invention, a multitude of spectral holes can simultaneously stabilize a portion of the multiple phase-locked spectral components of a mode-locked laser pulse train. This provides a way to stabilize frequency combs for relating, measuring, and characterizing optical frequency standards and is one way to provide a train of pulses for clock applications. By using spectral hole burning stabilization as an additional component in prior art frequency comb realizations, one may also improve their performance. Using a transient spectral hole burning material instead of a Fabry-Perot cavity, naturally fulfills the two conditions on matching relative mode spacing and coincidence of absolute frequency in a superior way, as shown in FIG. 15. The regenerating spectral holes naturally form and adjust to match the extremely uniform mode spacing set by the mode-locked laser. This eliminates the dispersive mismatch of each pulsed laser mode and its corresponding frequency reference (spectral hole). The languidity of the adjustment is determined by the hole lifetime and resists change for shorter timescales providing stabilization similar to that previously described in application to CW lasers, utilizing only one spectral hole. Since the modes of the laser pulse train are phase-locked together, hence the term mode-locked, it is only necessary to stabilize some fraction of them, and the other unstabilized modes will lock together with the stabilized modes. This simplifies application of hole burning materials for stabilization, since the entire pulsed laser mode spectrum can span up to 10's to 100's of teraHertz wide bandwidths, many wavelengths; while typical inhomogeneous absorption bands are perhaps 10's to 100's of gigaHertz wide and may contain multiple spectral holes spaced by 100's of megaHertz or larger or closer spacing as set by the pulsed laser spectrum. The application may be expanded to utilize multiple inhomogeneously broadened absorption lines covering a multiplicity of frequency ranges as shown in FIG. 16. This may be done by employing multiple crystallographic sites for a particular ion in a single crystal host and consequently different absorption lines, employing more than one optical transition or wavelength in a single spectral hole burning material, or employing a sandwich or other structure of multiple different hole burning materials.

In an embodiment of the present invention a system absolute frequency stabilization is accomplished by combining transient spectral hole stabilization together with additional error signal contributions from the overall inhomogeneous lineshape. This hybrid invention provides a laser that combines short term stabilization with the additional capability to reduce frequency drift on longer time scales. Frequency locking can be achieved at an arbitrary point in the inhomogeneous line using this hybrid method by methods described in the specifications or related methods.

In an embodiment of the present invention a hybrid method of laser frequency stabilization is accomplished by combining the first described stabilization method, which uses the error signal from a narrow transient hole, together with an additional error signal or signals obtained from a second hole burning material or other atomic or molecular frequency reference or Fabry-Perot cavity reference.

In an embodiment of the present invention a laser stabilized to a transient spectral hole acts as a high quality local oscillator component in a larger frequency standard or clock system that provides an accurate absolute time and frequency reference for applications.

In an embodiment of the present invention the stabilized laser acts as a frequency stabilization component for a frequency synthesizer.

In an embodiment of the present invention the stabilized laser acts as a multi-mode frequency stabilization component in a frequency comb system based on mode locked laser or related source.

In an embodiment of the present invention a laser locked to transient spectral holes provides a portable and transportable frequency reference. Their excellent short term stability and vibration resistance are especially enabling to applications.

In an embodiment of the present invention a laser locked to a transient hole is compact and portable relative to typical atomic standards. Atomic standards cannot support several frequencies in the same spectral region, as spectral hole references can. Fabry-Perot standards are not absolute and are sensitive to vibration. Reduced vibrational sensitivity is a major advantage of this technology relative to other methods.

In an embodiment of the present invention a laser stabilized to a transient hole enables other hole burning applications, but it is also has stand-alone applications in other fields completely unrelated to spectral hole burning. There are broad areas where stable lasers have been employed. There are also new potential areas in optoelectronics and telecommunications, in optical storage and array processing, in the biological application of correlators and in areas of spectral hole burning devices under development. Laboratory applications for material characterization and device development are important.

Satellite arrays such as TechSat21, Global Positioning Systems, and optical communications using coherent light detection are illustrations where coordination of frequencies and phase over great distance is critical. Laser sources for new fast ultra-dense optical memories and real time optical correlators are among other spectral hole burning applications. Applications also include generation of teraHertz radiation or other combination radiation by beating of two stable lasers in a nonlinear optical material; teraHertz radiation is an underutilized part of the electromagnetic spectrum that has captured a lot of attention recently; for example, teraHertz radiation allows imaging through obscuring objects.

Laser ranging applications include many other terrestrial and satellite applications based on Doppler shifts and coherent detection methods. Laser ranging for the Air Force 'TechSat-21' program is a current opportunity and other satellite arrays are envisioned for both commercial and military applications. Ultra sensitive vibration sensing devices are also enabled, along with an array of types of optical and fiber optical sensors needing stable laser sources. In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. The spirit and scope of the invention is defined in the appended claims and their equivalents.

What is claimed is:

1. A method for stabilizing a laser at a selectable frequency, the method comprising the steps of:

outputting a beam from a frequency adjustable laser at a selected frequency;

splitting the output beam into a first beam and a second beam, the first beam to be used in a separate application after the frequency adjustable laser is stabilized at the selected frequency, the second beam to be used for stabilizing the frequency adjustable laser at the selected frequency;

transmitting the second beam through a spectral hole burning material having an inhomogeneously broadened absorption line and capable of supporting a transient spectral hole or holes for a lifetime characteristic of the spectral hole burning material, the transient spectral hole in the inhomogeneously broadened absorption being used as a frequency and/or phase reference, and at least one of the spectrum, amplitude and phase of the second beam being modified via interaction with the spectral hole burning material;

transmitting the second beam, after passing through the spectral hole burning material, onto a detector to provide an electrical signal output of sensed changes in the second beam; and adjusting the laser via feedback control, according to an adjusting signal derived from the electrical signal output from the detector, to stabilize the frequency adjustable laser at the selected frequency.

2. The method of claim 1, comprising the additional step of preparing the spectral hole burning material for transient spectral hole burning before transmitting the second beam through the spectral hole burning material.

3. The method of claim 2, wherein the step of preparing the spectral hole burning material comprises population storage in the excited state of an optically active ion.

4. The method of claim 2, wherein the step of preparing the spectral hole burning material comprises population storage in the intermediate state of an optically active ion.

5. The method of claim 2, wherein the step of preparing the spectral hole burning material comprises population storage in the excited state of an optically active molecule.

6. The method of claim 2, wherein the step of preparing the spectral hole burning material comprises population storage in the intermediate state of an optically active molecule.

7. The method of claim 1, comprising the additional step of:

modulating the second beam before transmitting the second beam through the spectral hole burning material; wherein deriving the adjusting signal from the electrical signal output from the detector includes filtering the electrical signal to generate the error signal, and demodulating the error signal to provide a demodulated error signal, the frequency adjustable laser is adjusted using the demodulated error signal.

8. The method of claim 7, wherein the modulating of the second beam is out of phase with the demodulating of the error signal.

9. The method of claim 8, wherein the demodulated electrical signal comprises:

a first component attributed to at least one transient spectral hole; and a second component not attributed to the at least one transient spectral hole.

10. The method of claim 9, wherein the second component is attributed to the inhomogeneous broadened absorption line of the spectral hole burning material.

11. The method of claim 10, wherein the step of adjusting the laser according to the electrical signal includes adjusting the laser according to the first component and the second component.

12. The method of claim 1, wherein the adjustable laser is a mode-locked laser.

13. The method of claim 1, wherein the adjustable laser is a single mode laser.

14. A laser stabilization device, comprising:

a frequency adjustable laser;

a beam splitter for splitting the beam from the frequency adjustable laser into a first beam and a second beam, the first beam being output to a separate application after the frequency adjustable laser is stabilized at a selected frequency;

a transient spectral hole burning material receiving the second beam and having an inhomogeneously broadened absorption line and capable of supporting a transient spectral hole or holes for a lifetime characteristic of the spectral hole burning material, the transient spectral hole in the inhomogeneously broadened absorption line providing a frequency and/or phase reference, and at least one of the spectrum, amplitude and phase of the second beam being modified via interaction with the spectral hole burning material;

a detector configured to sense the changes in the second beam after passing through the transient spectral hole burning material and output an electrical signal of the sensed changes; and servo electronics for stabilizing the frequency adjustable laser at the selected frequency in response to an adjusting signal derived from the electrical signal output from the detector.

15. The laser stabilization device of claim 14, wherein the frequency adjustable laser is a single mode laser.

16. The laser stabilization device of claim 14, wherein the frequency adjustable laser is a mode-locked laser.

17. The laser stabilization device of claim 14, further comprising:

a modulator for modulating the second beam; and a demodulator for demodulating the electrical signal output from the detector.

18. The laser stabilization device of claim 17, wherein the modulator and the demodulator operate at the same frequency and a different phase.

19. The laser stabilization device of claim 17, wherein the electrical signal comprises:

a first component attributed to at least one spectral hole; and a second component not attributed to the at least one spectral hole.

20. The laser stabilization device of claim 17, wherein the modulator and the demodulator operate at a different frequency and different phase.

* * * * *

UNITED STATES PATENT AND TRADEMARK OFFICE
CERTIFICATE OF CORRECTION

PATENT NO. : 6,654,394 B1
DATED : November 25, 2003
INVENTOR(S) : Peter B. Sellin et al.

Page 1 of 1

It is certified that error appears in the above-identified patent and that said Letters Patent is hereby corrected as shown below:

Title page,
Item [57], ABSTRACT, delete the last line "Additions here to encompass the mode-locked case?"

Signed and Sealed this

Twenty-eighth Day of December, 2004

JON W. DUDAS
*Director of the United States Patent and Trademark Office*

UNITED STATES PATENT AND TRADEMARK OFFICE
CERTIFICATE OF CORRECTION

PATENT NO. : 6,654,394 B1
DATED : November 25, 2003
INVENTOR(S) : Peter B. Sellin et al.

It is certified that error appears in the above-identified patent and that said Letters Patent is hereby corrected as shown below:

Column 1,
Line 3, insert:

-- Government Interest in the Invention

The subject matter of this disclosure was made with support from the government under Contract No. F49620-96-1-0466 awarded by the U.S. Air Force Office of Scientific Research. The Government may have certain rights in this invention. --.

Signed and Sealed this

Third Day of January, 2006

JON W. DUDAS
*Director of the United States Patent and Trademark Office*